(12) United States Patent
Lv et al.

(10) Patent No.: US 11,094,740 B2
(45) Date of Patent: Aug. 17, 2021

(54) BACKBOARD, DISPLAY DEVICE, AND METHOD FOR FABRICATING BACKBOARD

(71) Applicant: BOE Technology Group Co., Ltd., Beijing (CN)

(72) Inventors: Zhijun Lv, Beijing (CN); Liwen Dong, Beijing (CN); Wenqu Liu, Beijing (CN); Xiaoxin Song, Beijing (CN); Zhao Cui, Beijing (CN); Feng Zhang, Beijing (CN); Qi Yao, Beijing (CN); Changzheng Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/534,362

(22) Filed: Aug. 7, 2019

(65) Prior Publication Data
US 2020/0235160 A1 Jul. 23, 2020

(30) Foreign Application Priority Data
Jan. 18, 2019 (CN) .......................... 201910046927.1

(51) Int. Cl.
*H01L 33/62* (2010.01)
*H01L 27/15* (2006.01)
*H01L 33/00* (2010.01)

(52) U.S. Cl.
CPC .......... *H01L 27/153* (2013.01); *H01L 33/005* (2013.01); *H01L 33/62* (2013.01)

(58) Field of Classification Search
CPC .................... H01L 28/10; H01L 2933/0066
See application file for complete search history.

(56) References Cited

U.S. PATENT DOCUMENTS

| 9,461,222 B1* | 10/2016 | Wei .......................... H01L 33/62 |
| 2013/0168708 A1* | 7/2013 | Shibata ................... H01L 24/75 |
| | | 257/88 |

(Continued)

FOREIGN PATENT DOCUMENTS

| CN | 107305915 A | 10/2017 |
| CN | 107425101 A | 12/2017 |

(Continued)

OTHER PUBLICATIONS

Chinese Office Action for corresponding 201910046927.1 dated May 21, 2020.

*Primary Examiner* — Moazzam Hossain
(74) *Attorney, Agent, or Firm* — Arent Fox LLP; Michael Fainberg

(57) ABSTRACT

The disclosure discloses a backboard, a display device, and a method for fabricating the same, and the backboard includes: a backboard body; and a plurality of LED installation mounts arranged in an array on the backboard body, wherein each of the plurality of LED installation mounts includes at least two lead-out electrodes to be connected with LED pins, and a coil structure around each of the at least two lead-out electrodes, wherein the coil structure is configured to produce a magnetic field upon being powered on. The coils can be formed on the backboard body in the backboard to absorb electrodes of LEDs to thereby position them precisely so as to transfer the LEDs in a mass manner with a high good yield ratio, and the lead-out electrodes can be powered on to thereby detect abnormally operating LEDs.

18 Claims, 3 Drawing Sheets

(56) References Cited

U.S. PATENT DOCUMENTS

2013/0240922 A1\* 9/2013 Yamamoto ........ H01L 23/53214
257/89
2020/0013760 A1 1/2020 Lin et al.

FOREIGN PATENT DOCUMENTS

| CN | 107783331 A | 3/2018 |
| CN | 107863316 A | 3/2018 |
| CN | 108807265 A | 11/2018 |
| CN | 109065692 A | 12/2018 |

\* cited by examiner

BACKBOARD, DISPLAY DEVICE, AND METHOD FOR FABRICATING BACKBOARD

CROSS-REFERENCE TO RELATED APPLICATION

This application claims the priority of Chinese Patent Application No. 201910046927.1, filed with the Chinese Patent Office on Jan. 18, 2019, the content of which is hereby incorporated by reference in its entirety.

FIELD

The present disclosure relates to the field of display technologies, and particularly to a backboard, a display device, and a method for fabricating the same.

BACKGROUND

As the new generation of display technologies such as a micro Light-Emitting Diode (LED) display device and an Organic Light-Emitting Diode (OLED) display device are emerging, they have gradually taken the place of the liquid crystal display technologies, and become the predominant display technologies, and particularly the micro LED display device is superior to the OLED display device in terms of color reproduction, contrast, etc.

However the micro LED technologies are underdeveloped, there is a high production cost of the micro LEDs, and it is difficult to produce the micro LEDs in a mass manner, and particularly it is highly desirable in the art to transfer the LEDs in a mass manner with a high good yield ratio.

SUMMARY

Embodiments of the disclosure disclose a backboard, a display device, and a method for fabricating the same.

In order to attain the object above, there are the following technical solutions according to the embodiments of the disclosure.

An embodiment of the disclosure provides a backboard including:

a backboard body; and a plurality of LED installation mounts arranged in an array on the backboard body, wherein each of the plurality of LED installation mounts includes at least two lead-out electrodes to be connected with LED pins, and a coil structure around each of the at least two lead-out electrodes, wherein the coil structure is configured to produce a magnetic field upon being powered on.

In the backboard above, when a transfer body carrying an array of LEDs is aligned with the backboard body including the array of LED installation mounts, the LEDs correspond to the LED installation mounts, and when the coil structures are powered on, the coil structures produce a magnetic field, so that the magnetic field produced by the coil structures absorbs the corresponding pins in the LEDs in the combination of the paired LEDs and installation mounts, and the pins are automatically positioned precisely onto the lead-out electrodes in the corresponding coil structures.

In some embodiments, the coil structure includes a plurality of layers of annular metal line patterns with indentations, and a dielectric layer is between every two adjacent layers of metal line patterns; and the dielectric layer between every two adjacent layers of metal line patterns is formed with a via hole, and every two adjacent layers of metal line patterns are electrically connected through the via hole.

In some embodiments, the metal line patterns extend along a rectangular locus or circular locus.

In some embodiments, the thickness of the dielectric layer ranges from 500 Å to 1000 Å, and the thickness of the metal line patterns ranges from 400 Å to 800 Å.

In some embodiments, the material of the dielectric layer includes $SiN_x$, $SiO_x$, or SiON.

In some embodiments, each of the plurality of LED installation mounts includes at least two coil structures, and the respective coil structures are connected with each other through an electrically-conductive bridge.

In some embodiments, each of the plurality of LED installation mounts further comprises backboard electrodes between the lead-out electrodes and the backboard body.

In some embodiments, each of the plurality of LED installation mounts includes two lead-out electrodes so that an LED with two pins is installed on the LED installation mount; or each of the plurality of LED installation mounts includes three lead-out electrodes so that an LED with three pins is installed on the LED installation mount.

An embodiment of the disclosure provides a method for fabricating a backboard, the method including:

preparing a backboard body; and forming a plurality of LED installation mounts arranged in an array on the backboard body, wherein each of the plurality of LED installation mounts includes at least two lead-out electrodes to be connected with LED pins, and a coil structure around each of the at least two lead-out electrodes, wherein the coil structure is configured to produce a magnetic field upon being powered on.

In some embodiments, the forming the plurality of LED installation mounts arranged in an array on the backboard body includes:

forming metal line patterns with indentations, and dielectric layers with via holes alternately on the backboard body in a patterning process, wherein two adjacent layers of metal line patterns are electrically connected through the via holes so that the respective layers of metal line patterns with the indentations are connected to form the coil structures;

forming through-holes running to the backboard body at the dielectric layers in the metal line patterns; and forming electrically-conductive media in the through-holes, and patterning the electrically-conductive media to form the lead-out electrodes.

In some embodiments, after the forming the plurality of LED installation mounts arranged in an array on the backboard body, the method further includes: forming an electrically-conductive bridge to connect the respective coil structures sequentially.

An embodiment of the disclosure provides a display panel including the backboard, wherein the backboard comprises a backboard body, and a plurality of LED, Light Emitting Diode, installation mounts arranged in an array on the backboard body, wherein each of the plurality of LED installation mounts comprises at least two lead-out electrodes to be connected with LED pins, and a coil structure around each of the at least two lead-out electrodes, wherein the coil structure is configured to produce a magnetic field upon being powered on, wherein:

LEDs on the LED installation mounts, wherein pins of the LEDs come into contact with the lead-out electrodes of the corresponding LED installation mounts in a one-to-one manner; and a protective film packaging sides of the LEDs away from the backboard body.

In some embodiments, the coil structure comprises a plurality of layers of annular metal line patterns with indentations, and a dielectric layer is between every two adjacent layers of metal line patterns; and the dielectric layer between every two adjacent layers of metal line patterns is formed with a via hole, and every two adjacent layers of metal line patterns are electrically connected through the via hole.

In some embodiments, the thickness of the dielectric layer ranges from 500 Å to 1000 Å, and the thickness of the metal line patterns ranges from 400 Å to 800 Å.

In some embodiments, each of the plurality of LED installation mounts comprises at least two coil structures, and the respective coil structures are connected with each other through an electrically-conductive bridge.

In some embodiments, each of the plurality of LED installation mounts further comprises backboard electrodes between the lead-out electrodes and the backboard body.

In some embodiments, each of the plurality of LED installation mounts comprises two lead-out electrodes so that an LED with two pins is installed on the LED installation mount; or each of the plurality of LED installation mounts comprises three lead-out electrodes so that an LED with three pins is installed on the LED installation mount.

An embodiment of the disclosure provides a method for fabricating a display device, the method including:

forming the backboard according to any one of claim 1;

aligning a transfer body in which LEDs are distributed, with the backboard body in the backboard so that at least a part of the LED installation mounts correspond to the LEDs;

powering on the coil structures in the backboard to generate a magnetic field;

releasing the LEDs in the transfer body onto the LED installation mounts; and packaging sides of the LEDs away from the backboard body with a protective film.

As compared with the related art, the method for fabricating a display device has the same advantages as the display device according to any one of the technical solutions above, so a repeated description thereof will be omitted here.

In some embodiments, after the releasing the LEDs in the transfer body onto the LED installation mounts, the method further includes:

powering on at least a part of the lead-out electrodes, scanning the LEDs, and recording the positions of the unqualified LEDs;

powering off coil structures corresponding to the unqualified LEDs so that the unqualified LEDs fall off; and powering on the coil structures corresponding to the unqualified LEDs after the LEDs fall off, and supplementing another LEDs correspondingly.

In some embodiments, the transfer body includes a substrate, and a blue film adhered on a surface of the substrate, wherein the LEDs are bonded on the blue film; and the releasing the LEDs in the transfer body onto the LED installation mounts includes: photolyzing or pyrolyzing the blue film so that the LEDs in the transfer body are not bonded, and absorbing, by the coil structures in the LED installation mounts, the pins of the LEDs onto corresponding lead-out electrodes using the magnetic field.

DETAILED DESCRIPTION OF THE EMBODIMENTS

The technical solutions according to the embodiments of the disclosure will be described below clearly and fully with reference to the drawings in the embodiments of the disclosure. Apparently the embodiments to be described are only a part but all of the embodiments of the disclosure. Based upon the embodiments here of the disclosure, all of other embodiments which can occur to those ordinarily skilled in the art without any inventive effort shall come into the claimed scope of the disclosure.

Both the size of an LED 410, and the size of an LED installation mount range from 1 μm to 100 μm (including 1 μm and 100 μm).

Figure 3:
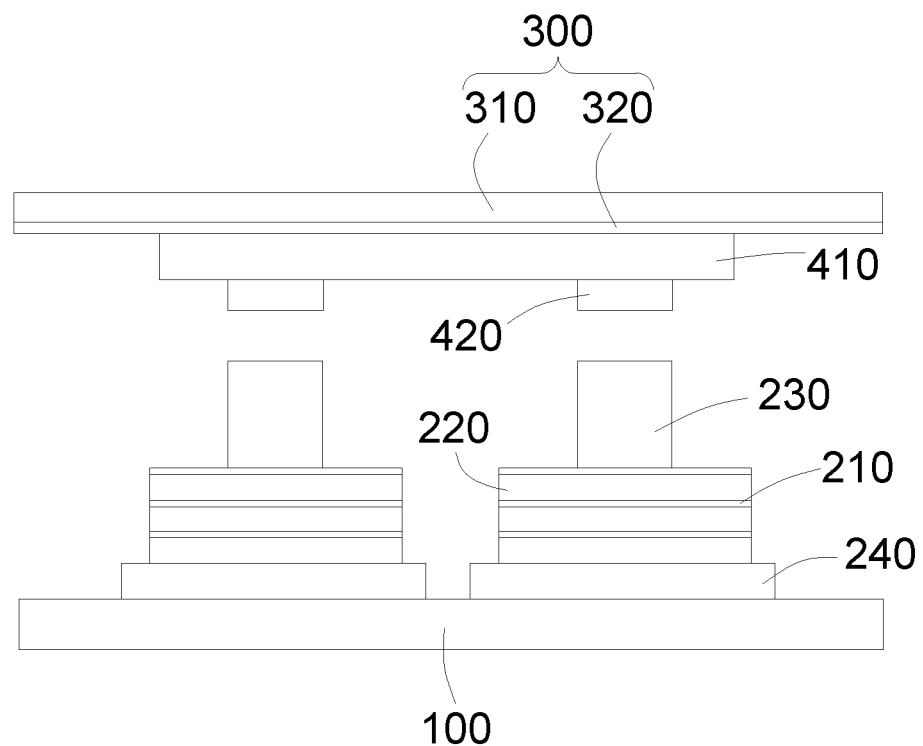
FIG. 3 is a schematic state diagram of transferring LEDs in a mass manner in a method for fabricating a display device according to the embodiments of the disclosure.

As illustrated in FIG. 3, a backboard according to embodiments of the disclosure includes:

a backboard body 100; and a plurality of LED installation mounts arranged in an array on the backboard body 100, where each of the plurality of LED installation mounts includes at least two lead-out electrodes 230 to be connected with pins 420 of an LED 410, and a coil structure 210 around each lead-out electrode 230, where the coil structure 210 is configured to generate a magnetic field upon being powered on.

In the backboard above, when a transfer body 300 carrying an array of LEDs 410 is aligned with the backboard body 100 including the array of LED installation mounts, the LEDs 410 correspond to the LED installation mounts, and when the coil structures 210 are powered on, the coil structures 210 generate a magnetic field, so that the magnetic field generated by the coil structures 210 absorbs the corresponding pins 420 in the LEDs 410 in the combination of the paired LEDs 410 and LED installation mounts, and the pins 420 are automatically positioned precisely onto the lead-out electrodes 230 in the corresponding coil structures 210, so the LEDs 410 are positioned precisely onto the LED installation mounts, thus transferring the LEDs in a mass manner with a high good yield ratio.

It shall be noted that in some embodiments, powering-on of the coil structures 210 and the lead-out electrodes 230 therein is controlled separately.

In order to facilitate contacting of the pins 420 of the LEDs 410 with the lead-out electrodes 230, the lead-out electrodes 230 extend beyond the coil structures 210.

Figure 1:
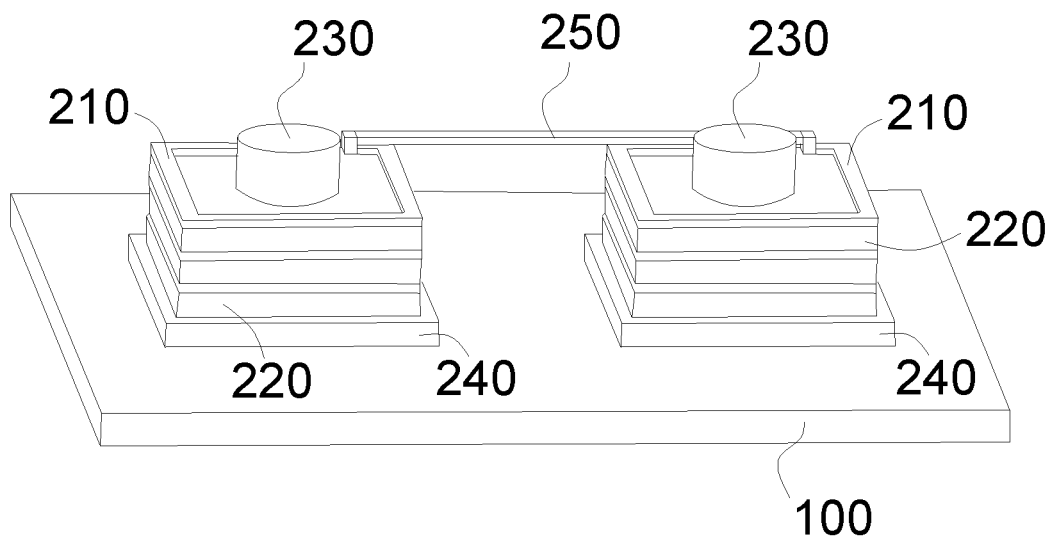
FIG. 1 is a schematic structural diagram of a backboard according to embodiments of the disclosure.
Figure 2:
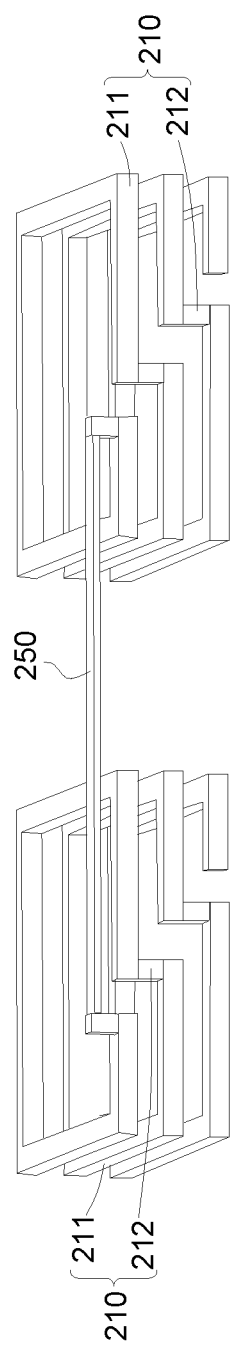
FIG. 2 is a schematic structural diagram of two coil structures connected through an electrically-conductive bridge in the backboard according to the embodiments of the disclosure.

In some embodiments, as illustrated in FIG. 1 or FIG. 2, each coil structure 210 includes a plurality of layers of annular metal line patterns 211 with indentations, and a dielectric layer 220 is between every two adjacent layers of metal line patterns 211.

The dielectric layer 220 between every two adjacent layers of metal line patterns 211 is formed with a via hole, and every two adjacent layers of metal line patterns 211 are electrically connected through the via hole.

In some embodiments, the via hole includes a connecting segment 212 connected respectively with the metal line patterns 211 on two sides of the corresponding dielectric layer 220 so that the respective layers of metal line patterns 211 are formed through the connecting segment 212 to form the coil structure 210.

Here the material of the dielectric layer 220 includes but will not be limited to $SiN_x$, $SiO_x$, or SiON, and the metal line patterns 211 extend along a rectangular locus or circular locus without any limitation thereto.

Here the thickness of the dielectric layer 220 ranges from 500 Å to 1000 Å, e.g., 500 Å, 700 Å, 900 Å, 1000 Å, etc., and the thickness of the metal line patterns 211 is 400 Å, 500 Å, 600 Å, 700 Å, 800 Å, etc.

In some embodiments, each LED installation mount includes at least two coil structures 210, and the respective coil structures 210 are connected with each other through an electrically-conductive bridge 250; and the electrically-conductive bridge 250 is formed to connect the respective coil structures 210 so that simply the coil structures 210 at two ends are powered on instead of powering on the respective coil structures 210 separately, to thereby structurally simplify a pattern of power supply lines on the backboard body 100.

In some embodiments, each coil structure 210 further includes lead-out terminals (not illustrated) connected to a power source, and when the respective coil structures 210 are connected with each other through the electrically-conductive bridge 250, the electrically-conductive bridge 250 is connected with one of the two lead-out terminals of the coil structures 210, and the lead-out terminals which are not connected with the electrically-conductive bridge 250 are a common lead-out terminal of the respective coil structures 210.

As illustrated in FIG. 1 and FIG. 2, each LED installation mount includes two coil structures 210, and the electrically-conductive bridge 250 is formed between the top metal line patterns 211 of the two coil structures 210.

Each LED installation mount can further include three or more coil structures 210 so that an LED 410 with a plurality of pins 420 can be installed, and the plurality of coil structures 210 are connected sequentially with each other in a closed manner through the electrically-conductive bridge 250. In some embodiments, the LED installation mount includes four LEDs 410, for example, and the end of the top metal line pattern 211 of the first coil structure 210 is connected with the end of the top metal line pattern 211 of the second coil structure 210 through the first electrically-conductive bridge 250, and the end of the bottom metal line pattern 211 of the second coil structure 210 is connected with the end of the bottom metal line pattern 211 of the third coil structure 210 through the second electrically-conductive bridge 250.

In some embodiments, backboard electrodes 240 are between the lead-out electrodes 230 and the backboard body 100 to thereby facilitate powering-on of the lead-out electrodes 230.

In some embodiments, each LED installation mount includes two lead-out electrodes 230 so that an LED 410 with two pins 420 can be installed on the LED installation mount, where the two lead-out electrodes 230 contact respectively with the two pins 420 in a one-to-one manner.

In some embodiments, each LED installation mount includes three lead-out electrodes 230 so that an LED 410 with three pins 420 can be installed on the LED installation mount, where the three lead-out electrodes 230 contact respectively with the three pins 420 in a one-to-one manner.

A method for fabricating a backboard according to an embodiment of the disclosure includes following steps.

Step S1100 is to prepare a backboard body 100.

Step S1200 is to form a plurality of LED installation mounts arranged in an array on the backboard body 100, where each of the plurality of LED installation mounts includes at least two lead-out electrodes 230 to be connected with pins 420 of an LED 410, and a coil structure 210 around each of the at least two lead-out electrodes 230, where the coil structure 210 is configured to generate a magnetic field upon being powered on.

In the method above for fabricating a backboard, the LED installation mounts arranged in an array is formed on the backboard body 100 in the step S1200, and since there are at least two lead-out electrodes 230 in each LED installation mount, and the coil structure 210 is arranged around each lead-out electrode 230, when a transfer body 300 carrying an array of LEDs 410 is aligned with the backboard body 100 including the array of LED installation mounts, the LEDs 410 correspond to the LED installation mounts, and when the coil structures 210 are powered on, the coil structures 210 generate a magnetic field, so that the magnetic field generated by the coil structures 210 absorbs the corresponding pins 420 in the LEDs 410 in the combination of the paired LEDs 410 and LED installation mounts, and the pins 420 are automatically positioned precisely onto the lead-out electrodes 230 in the corresponding coil structures 210, so the LEDs 410 are positioned precisely onto the LED installation mounts, thus transferring the LEDs in a mass manner with a high good yield ratio.

In the method above for fabricating a backboard, an optional implementation of the step S1200 is as follows:

metal line patterns 211 with indentations, and dielectric layers 220 with via-holes are formed alternately on the backboard body 100 in a patterning process, where two adjacent layers of metal line patterns 211 are electrically connected through the via-holes so that the respective layers of metal line patterns 211 with the indentations are connected to form the coil structures 210;

through-holes running to the backboard body 100 are formed at the dielectric layers 220 in the metal line patterns 211; and electrically-conductive media are formed in the through-holes and patterned to form the lead-out electrodes 230.

In some embodiments, referring to the structure as illustrated in FIG. 1.

Step S1210 is to form a backboard electrode 240 on the backboard body 100 at positions corresponding to each lead-out electrode 230 in a patterning process.

Step S1220 is to form a first layer of dielectric layer 220 on the backboard electrode 240 in a patterning process.

Step S1230 is to form a first layer of annular metal line pattern 211 including an indentation.

Step S1240 is to form a second layer of dielectric layer 220 on the first layer of metal line pattern 211 in a pattering process, and to form a first via-hole at the second layer of dielectric layer 220 at a position corresponding to the indentation of the first layer of annular metal line pattern 211.

Step S1250 is to deposit an electrically-conductive medium in the first via hole to form a first connecting segment 212, where one end of the first connecting segment 212 is connected with one end at the indentation of the first layer of annular metal line pattern 211.

Step S1260 is to form a second layer of metal line pattern 211 including an indentation on the second layer of dielectric layer 220 in a patterning process, where one end of the indentation of the second layer of metal line pattern 211 comes into contact with the other end of the first connecting segment 212, and the first layer of annular metal line pattern 211, the first connecting segment 212, the second layer of metal line pattern 211, a second connecting segment 212, and a third layer of metal line pattern 211 are connected sequentially in a closed manner to form the coil structure 210.

Step S1270 is to form a through-hole running to the backboard electrode 240 through the respective dielectric layers 220 in an area surrounded by the coil structure 210 in a patterning process.

Step S1280 is to form an electrically-conductive medium in the through-hole, and to pattern the electrically-conductive medium to form the lead-out electrode 230.

In the process above, the first layer of dielectric layers 220 are firstly formed on the backboard electrodes 240 to thereby prevent the first layers of metal line patterns 211 from coming into contact with the backboard electrodes 240, which substantially does not easily cause a short circuit between the backboard electrodes 240 and the metal line patterns 211 when subsequently the lead-out electrodes 230 come into contact with the pins 420 of the LEDs 410, and the respective coil structures 210 are connected through the electrically-conductive bridge 250.

It shall be noted that the backboard electrodes 240 may not necessarily be arranged as long as the lead-out electrodes 230 and the coil structures 210 are powered on separately, and for example, the lead-out electrodes 230 and the coil structures 210 are powered on respectively by power supply line patterns formed on the backboard body 100.

Furthermore neither the number of layers of dielectric layers 220, nor the number of layers of metal line patterns 211 will be limited to a particular number of layers, but there is at least one layer of dielectric layer 220, and there are at least two layers of metal line patterns 211.

There may be another implementation of the step S1200 than the implementation above thereof, for example, the coil structures 210 including the lead-out electrodes 230 at the middle thereof are trans-printed directly onto the backboard body 100.

Moreover referring to the structure as illustrated in FIG. 1 and FIG. 2, after the step S1200, the method can further include forming an electrically-conductive bridge 250 in a patterning process to connect the respective coil structures 210 sequentially. Where, the electrically-conductive bridge 250 can be formed at the same layer as some layer of metal line pattern 211 in the coil structures 210, or can be formed after the coil structures 210 are formed.

Figure 4:
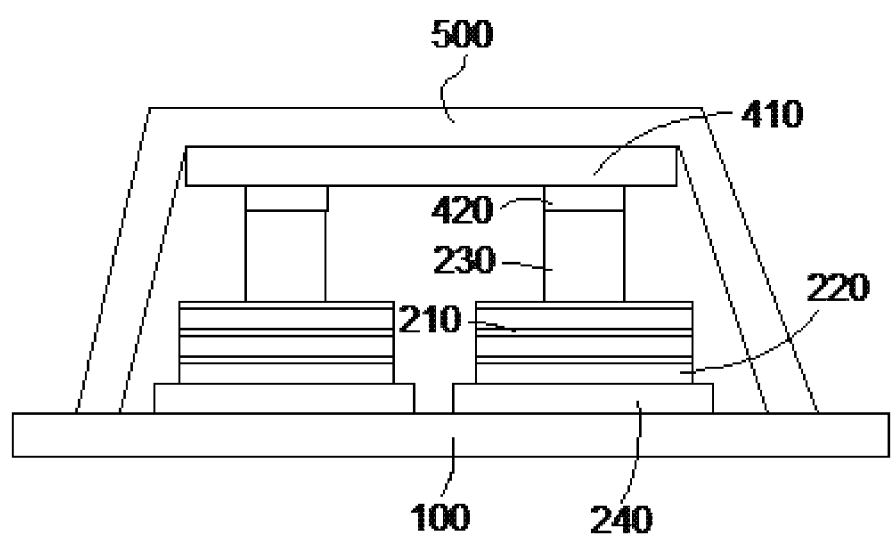
FIG. 4 is a schematic structural diagram of the LEDs engaged with a backboard in the method for fabricating a display device according to the embodiments of the disclosure.

As illustrated in FIG. 4, a display device according to embodiments of the disclosure includes: a display panel including the backboard according to the embodiments of the disclosure, LEDs 410 on the LED installation mounts, where pins 420 of the LEDs 410 come into contact with the lead-out electrodes 230 of the corresponding LED installation mounts in a one-to-one manner; and a protective film 500 packaging sides of the LEDs 410 away from the backboard body 100.

Here as illustrated in FIG. 4, each LED 410 can be packaged separately and covered with a protective film 500 so that the protective film 500 covers both the LED 410 and its corresponding LED installation mount, and the edge of the protective film 500 comes into contact and is fixed with the backboard body 100; or a plurality of LEDs 410 can be packaged with the same protective film 500.

The display device above can be fabricated in such a way that the LEDs are transferred in a mass manner with a high good yield ratio. When a transfer body 300 carrying an array of LEDs 410 is aligned with the backboard body 100 including the array of LED installation mounts, the LEDs 410 correspond to the LED installation mounts, and when the coil structures 210 are powered on, the coil structures 210 generate a magnetic field, so that the magnetic field generated by the coil structures 210 absorbs the corresponding pins 420 in the LEDs 410 in the combination of the paired LEDs 410 and LED installation mounts, and the pins 420 are automatically positioned precisely onto the lead-out electrodes 230 in the corresponding coil structures 210, so the LEDs 410 are positioned precisely onto the LED installation mounts, thus transferring the LEDs in a mass manner with a high good yield ratio. The sides of the LEDs 410 away from the backboard body 100 are packaged with the protective film 500 to thereby protect the LEDs 410 from falling off or being damaged.

As illustrated in FIG. 3, a method for fabricating the display device according to embodiments of the disclosure includes the following steps.

Step S1000 is to prepare the backboard according to the embodiments of the disclosure.

Step S2000 is to align a transfer body 300 in which LEDs 410 are distributed, with the backboard body 100 in the backboard so that at least a part of the LED installation mounts correspond to the LEDs 410.

Step S3000 is to power on the coil structures 210 in the backboard to generate a magnetic field, and to release the LEDs 410 in the transfer body 300 onto the LED installation mounts so that the pins 420 of the LEDs 410 come into contact with the lead-out electrodes 230 in their corresponding LED installation mounts in a one-to-one manner.

As illustrated in FIG. 4, the sides of the LEDs 410 away from the backboard body 100 are packaged with the protective film 500.

In the method above for fabricating a display device, the LEDs can be transferred in a mass manner with a high good yield ratio. When the transfer body 300 carrying an array of LEDs 410 is aligned with the backboard body 100 including the array of LED installation mounts, the LEDs 410 correspond to the LED installation mounts, and when the coil structures 210 are powered on, the coil structures 210 generate a magnetic field, so that the magnetic field generated by the coil structures 210 absorbs the corresponding pins 420 in the LEDs 410 in the combination of the paired LEDs 410 and LED installation mounts, and the pins 420 are automatically positioned precisely onto the lead-out electrodes 230 in the corresponding coil structures 210, so the LEDs 410 are positioned precisely onto the LED installation mounts, thus transferring the LEDs in a mass manner with a high good yield ratio. The sides of the LEDs 410 away from the backboard body 100 are packaged with the protective film 500 to thereby protect the LEDs 410 from falling off or being damaged.

Furthermore after the step S3000, the method further includes step S4000 of detecting whether the LED is qualified and causing the unqualified LEDs 410 to fall off, where the step S4000 includes:

step S4100 is to power on at least a part of the lead-out electrodes 230, to scan the LEDs 410, and to record the positions of the unqualified LEDs 410;

step S4200 is to power off coil structures 210 corresponding to the unqualified LEDs 410 so that the unqualified LEDs 410 fall off; and step S4300 is to power on the coil structures 210 corresponding to the unqualified LEDs after the LEDs 410 fall off, and to supplement another LEDs 410 correspondingly.

In some embodiments, the transfer body 300 includes a substrate 310, and a blue film 320 adhered on the surface of a substrate 310, where the LEDs 410 are bonded on the blue film 320.

In the step S3000, releasing the LEDs 410 on the transfer body 300 onto the LED installation mounts includes: photolyzing or pyrolyzing the blue film 320 so that the LEDs 410 in the transfer body are not bonded, and the coil structures 210 in the LED installation mounts absorb the pins 420 of the LEDs 410 onto corresponding lead-out electrodes 230 using the magnetic field.

However it shall be noted that the transfer body 300 can alternatively absorb the LEDs 410 electrostatically, using a magnetic force, etc.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A backboard, comprising:
a backboard body; and
a plurality of LED (Light Emitting Diode) installation mounts arranged in an array on the backboard body;
wherein each of the plurality of LED installation mounts comprises at least two lead-out electrodes to be connected with LED pins of LEDs, a coil structure around each of the at least two lead-out electrodes, and backboard electrodes between the lead-out electrodes and the backboard body; wherein each of the backboard electrodes is configured to power on its corresponding lead-out electrode;
wherein at least one dielectric layer is provided between the backboard electrodes and the coil structure, the dielectric layer is used to prevent electrical contact between the backboard electrode and the coil structure, and the coil structure is configured to generate a magnetic field to absorb the LED pins onto the corresponding lead-out electrodes upon being powered on.

2. The backboard according to claim 1, wherein the coil structure comprises a plurality of layers of annular metal line patterns with indentations, and a dielectric layer is between every two adjacent layers of metal line patterns; and
the dielectric layer between every two adjacent layers of metal line patterns is formed with a via hole, and every two adjacent layers of metal line patterns are electrically connected through the via hole.

3. The backboard according to claim 2, wherein the metal line patterns extend along a rectangular locus or circular locus.

4. The backboard according to claim 2, wherein the thickness of the dielectric layer ranges from 500 Å to 1000 Å, and the thickness of the metal line patterns ranges from 400 Å to 800 Å.

5. The backboard according to claim 2, wherein the material of the dielectric layer comprises $SiN_x$, $SiO_x$, or SiON.

6. The backboard according to claim 1, wherein each of the plurality of LED installation mounts comprises at least two coil structures, and the respective coil structures are connected with each other through an electrically-conductive bridge.

7. The backboard according to claim 1, wherein each of the plurality of LED installation mounts comprises two lead-out electrodes so that an LED with two pins is installed on the LED installation mount; or
each of the plurality of LED installation mounts comprises three lead-out electrodes so that an LED with three pins is installed on the LED installation mount.

8. A method for fabricating the backboard in claim 1, the method comprising steps of:
preparing the backboard body; and
forming the plurality of LED (Light Emitting Diode) installation mounts arranged in an array on the backboard body, wherein each of the plurality of LED installation mounts comprises at least two lead-out electrodes to be connected with the LED pins of the LEDs, and the coil structure around each of the at least two lead-out electrodes, wherein the coil structure is configured to generate the magnetic field upon being powered on.

9. The method for fabricating a backboard according to claim 8, wherein the forming the plurality of LED installation mounts arranged in an array on the backboard body comprises:
forming metal line patterns with indentations, and dielectric layers with via holes alternately on the backboard body in a patterning process, wherein two adjacent layers of metal line patterns are electrically connected through the via holes so that the respective layers of metal line patterns with the indentations are connected to form the coil structures;
forming through-holes running to the backboard body at the dielectric layers in the metal line patterns; and
forming electrically-conductive media in the through-holes, and patterning the electrically-conductive media to form the lead-out electrodes.

10. The method for fabricating a backboard according to claim 8, wherein after the forming the plurality of LED installation mounts arranged in an array on the backboard body, the method further comprises: forming an electrically-conductive bridge to connect the respective coil structures sequentially.

11. A display device, comprising:
a display panel comprising a backboard, wherein the backboard comprises a backboard body, and a plurality of LED (Light Emitting Diode) installation mounts arranged in an array on the backboard body;
wherein each of the plurality of LED installation mounts comprises at least two lead-out electrodes to be connected with LED pins of LEDs, a coil structure around each of the at least two lead-out electrodes, and backboard electrodes between the lead-out electrodes and the backboard body; wherein each of the backboard electrodes is configured to power on its corresponding lead-out electrode;
wherein at least one dielectric layer is provided between the backboard electrodes and the coil structure, the dielectric layer is used to prevent electrical contact between the backboard electrode and the coil structure, and the coil structure is configured to generate a magnetic field to absorb the LED pins onto the corresponding lead-out electrodes upon being powered on;
LEDs on the LED installation mounts, wherein the LED pins of the LEDs come into contact with the lead-out electrodes of the corresponding LED installation mounts in a one-to-one manner; and
a protective film packaging sides of the LEDs away from the backboard body.

12. The display device according to claim 11, wherein the coil structure comprises a plurality of layers of annular metal line patterns with indentations, and a dielectric layer is between every two adjacent layers of metal line patterns; and the dielectric layer between every two adjacent layers of metal line patterns is formed with a via hole, and every two adjacent layers of metal line patterns are electrically connected through the via hole.

13. The display device according to claim 12, wherein the thickness of the dielectric layer ranges from 500 Å to 1000 Å, and the thickness of the metal line patterns ranges from 400 Å to 800 Å.

14. The display device according to claim 11, wherein each of the plurality of LED installation mounts comprises at least two coil structures, and the respective coil structures are connected with each other through an electrically-conductive bridge.

15. The display device according to claim 11, wherein each of the plurality of LED installation mounts comprises two lead-out electrodes so that an LED with two pins is installed on the LED installation mount; or each of the plurality of LED installation mounts comprises three lead-out electrodes so that an LED with three pins is installed on the LED installation mount.

16. A method for fabricating a display device, the method comprising:

forming the backboard according to claim 1;

aligning a transfer body in which LEDs are distributed, with the backboard body in the backboard so that at least a part of the LED installation mounts correspond to the LEDs;

powering on the coil structures in the backboard to generate a magnetic field;

releasing the LEDs in the transfer body onto the LED installation mounts; and packaging sides of the LEDs away from the backboard body with a protective film.

17. The method for fabricating a display device according to claim 16, wherein after the releasing the LEDs in the transfer body onto the LED installation mounts, the method further comprises:

powering on at least a part of the lead-out electrodes, scanning the LEDs, and recording the positions of the unqualified LEDs;

powering off coil structures corresponding to the unqualified LEDs so that the unqualified LEDs fall off; and powering on the coil structures corresponding to the unqualified LEDs after the LEDs fall off, and supplementing another LEDs correspondingly.

18. The method for fabricating a display device according to claim 16, wherein the transfer body comprises a substrate, and a blue film adhered on a surface of the substrate, wherein the LEDs are bonded on the blue film; and the releasing the LEDs in the transfer body onto the LED installation mounts comprises: photolyzing or pyrolyzing the blue film so that the LEDs in the transfer body are not bonded, and absorbing, by the coil structures in the LED installation mounts, the LED pins of the LEDs onto corresponding lead-out electrodes using the magnetic field.

* * * * *